(12) United States Patent
Faucett

(10) Patent No.: US 9,046,906 B1
(45) Date of Patent: Jun. 2, 2015

(54) HIGHLY SURVIVABLE AND RUGGED COMPUTER ASSEMBLY

(75) Inventor: Tim Faucett, Oregon City, OR (US)

(73) Assignee: APlus Mobile Inc., Oregon City, OR (US)

( * ) Notice: Subject to any disclaimer, the term of this patent is extended or adjusted under 35 U.S.C. 154(b) by 327 days.

(21) Appl. No.: 13/370,651

(22) Filed: Feb. 10, 2012

(51) Int. Cl.
| H05K 7/20 | (2006.01) |
| G06F 1/16 | (2006.01) |
| G06F 1/20 | (2006.01) |
| G05F 1/16 | (2006.01) |
| H05K 7/18 | (2006.01) |
| H05K 7/14 | (2006.01) |

(52) U.S. Cl.
CPC .. *G05F 1/16* (2013.01); *H05K 7/20* (2013.01); *H05K 7/18* (2013.01); *H05K 7/1492* (2013.01); *G06F 1/203* (2013.01); *G06F 1/20* (2013.01)

(58) Field of Classification Search
CPC ......... H05K 7/20; H05K 7/18; H05K 7/1492; G06F 1/16; G06F 1/20; G06F 1/203
USPC ................. 361/679.02, 688, 679.46
See application file for complete search history.

(56) References Cited

U.S. PATENT DOCUMENTS

| 3,593,064 | A | * | 7/1971 | Wagner et al. | 361/707 |
| 5,175,873 | A | * | 12/1992 | Goldenberg et al. | 455/351 |
| 6,049,813 | A | * | 4/2000 | Danielson et al. | 708/100 |
| 6,179,122 | B1 | * | 1/2001 | Moncrief et al. | 206/320 |
| D472,384 | S | * | 4/2003 | Richardson | D3/273 |
| 6,618,246 | B2 | | 9/2003 | Sullivan et al. | |
| 6,698,608 | B2 | * | 3/2004 | Parker et al. | 220/4.22 |
| 6,735,450 | B1 | * | 5/2004 | Remmert | 455/550.1 |
| 6,995,976 | B2 | * | 2/2006 | Richardson | 345/173 |
| 7,230,823 | B2 | * | 6/2007 | Richardson et al. | 361/679.25 |
| 7,339,786 | B2 | * | 3/2008 | Bottom et al. | 361/679.41 |
| 7,517,231 | B2 | * | 4/2009 | Hiew et al. | 439/76.1 |
| 7,773,375 | B1 | * | 8/2010 | Faucett | 361/679.49 |
| 7,845,395 | B2 | | 12/2010 | Chu | |
| 7,953,897 | B2 | | 5/2011 | Lum | |
| 8,031,464 | B2 | | 10/2011 | Adkins et al. | |
| 8,289,714 | B2 | * | 10/2012 | Faucett et al. | 361/719 |
| 8,619,417 | B1 | * | 12/2013 | Helton | 361/679.41 |
| 2002/0124114 | A1 | * | 9/2002 | Bottom et al. | 709/251 |
| 2006/0064524 | A1 | | 3/2006 | Lum | |
| 2007/0025069 | A1 | * | 2/2007 | Yokote | 361/680 |
| 2009/0086420 | A1 | | 4/2009 | Stockham et al. | |
| 2010/0195281 | A1 | * | 8/2010 | Lum | 361/679.52 |
| 2011/0213984 | A1 | | 9/2011 | Orlando et al. | |
| 2012/0008283 | A1 | * | 1/2012 | Faucett et al. | 361/718 |
| 2012/0314354 | A1 | * | 12/2012 | Rayner | 361/679.01 |

FOREIGN PATENT DOCUMENTS

EP            610689 A1 *  8/1994    ............... H01H 9/02

* cited by examiner

*Primary Examiner* — Anatoly Vortman
(74) *Attorney, Agent, or Firm* — Timothy E. Siegel Patent Law, PLLC; Timothy E. Siegel

(57) ABSTRACT

A ruggedized computer assembly that includes a liquids proof case made of thermally conductive material and having an exterior surface and an interior surface. Also, an electrically-powered cooling assembly is supported on the exterior surface and draws heat from the exterior surface. Moreover, a plurality of computers is housed in the case, and supported by and thermally connected to the interior surface of the case, so that heat is transferred from the computer assembly, through the liquids proof case, to the cooling assembly.

15 Claims, 3 Drawing Sheets

US 9,046,906 B1

HIGHLY SURVIVABLE AND RUGGED COMPUTER ASSEMBLY

BACKGROUND

There is a need for ruggedized computers for use, among other purposes, in robot vehicles. Such vehicles are distinct from remotely controlled vehicles, in that a robot vehicle is controlled by its own brain, in the form of a computer assembly. The computer assembly does so based on input from an array of instruments, which it interprets and responds to, in accordance with a governing set of computer programs. Accordingly, the computer assembly controls the acceleration, steering and braking of the robot vehicle. The computer assembly, upon which the vehicle performance is entirely dependent, is subjected to a harsh environment that includes jarring motion, temperature variation, far from perfect electrical supply and dust.

The industry response to the problem of providing computer control for robot vehicles has been somewhat piecemeal, typically resulting in a jerry rigged assortment of circuit boards, protected by various housings, all strung together. Performance has suffered from the resultant lack of computer survivability.

One problem standing in the way of a more integrated approach is the issue of getting heat out of a liquid sealed box. The more computer power a designer places into a sealed box, the greater the problem faced in avoiding overheating. Limiting the number of watts of exhaust heat that must be expressed through a single housing has caused designers to tend to split up the controlling vehicle brains into more than one housing, increasing vehicle weight, and thereby decreasing fuel efficiency. Efforts at redundant design, which is highly important for high survivability, have been held back by these concerns.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

An object of this invention is to provide a highly survivable and rugged computer assembly for applications in which the assembly will be jolted and subjected to heat and dust. In one preferred embodiment a plurality of computers is housed in a liquid sealed case that is cooled by two solid state cooling units. The computers are connected with a set of rugged jacks, facing outwardly from the exterior of the liquid sealed case.

In a first separate aspect, the present invention is a ruggedized computer assembly that includes a liquids proof case made of thermally conductive material and having an exterior surface and an interior surface. Also, an electrically-powered cooling assembly is supported on the exterior surface and draws heat from the exterior surface. Moreover, a plurality of computers is housed in the case, and supported by and thermally connected to the interior surface of the case, so that heat is transferred from the computer assembly, through the liquids proof case, to the cooling assembly.

In a second separate aspect, the present invention is a ruggedized computer assembly that has a liquids proof case, having an exterior and a plurality of computers housed in the liquids proof case, each of which has a central processing unit and a solid state hard drive and a computer bus, terminating in a jack at the case exterior. Also, the plurality of computers are joined together communicatively by an Ethernet switch that is also coupled by a plurality of buses to the case exterior, for use by an outside system.

In a third separate aspect, the present invention is a robot vehicle that has a ruggedized computer assembly, which includes a liquids proof case, having an exterior; a plurality of computers housed in the liquids proof case, each the computer having: a central processing unit; a solid state hard drive; and a computer bus, terminating in a jack at the case exterior; and wherein the plurality of computers are joined together communicatively by an Ethernet switch that is also coupled by a plurality of buses to the case exterior, for use by the robot vehicle.

In a fourth separate aspect, the present invention is a method of facilitating the design and construction of robot vehicles, comprising producing liquid-sealed, solid state cooled computer assemblies, each having a liquid sealed case and a plurality of computers, inside the liquid sealed case, each having a CPU, and a solid state disk drive. Further, each computer is connected to a plurality of ruggedized connectors mounted facing outwardly on the case and an interior switch is connected to each computer and to a set of connectors mounted on the case. The computer assemblies are made available to robot vehicle manufacturers, thereby easing the task of each individual robot vehicle manufacturer in producing a computer control system for a vehicle design.

In addition to the exemplary aspects and embodiments described above, further aspects and embodiments will become apparent by reference to the drawings and by study of the following detailed descriptions.

BRIEF DESCRIPTION OF THE DRAWINGS

Exemplary embodiments are illustrated in referenced drawings. It is intended that the embodiments and figures disclosed herein are to be considered illustrative rather than restrictive.

DETAILED DESCRIPTION OF THE PREFERRED EMBODIMENT(S)

Figure 1:
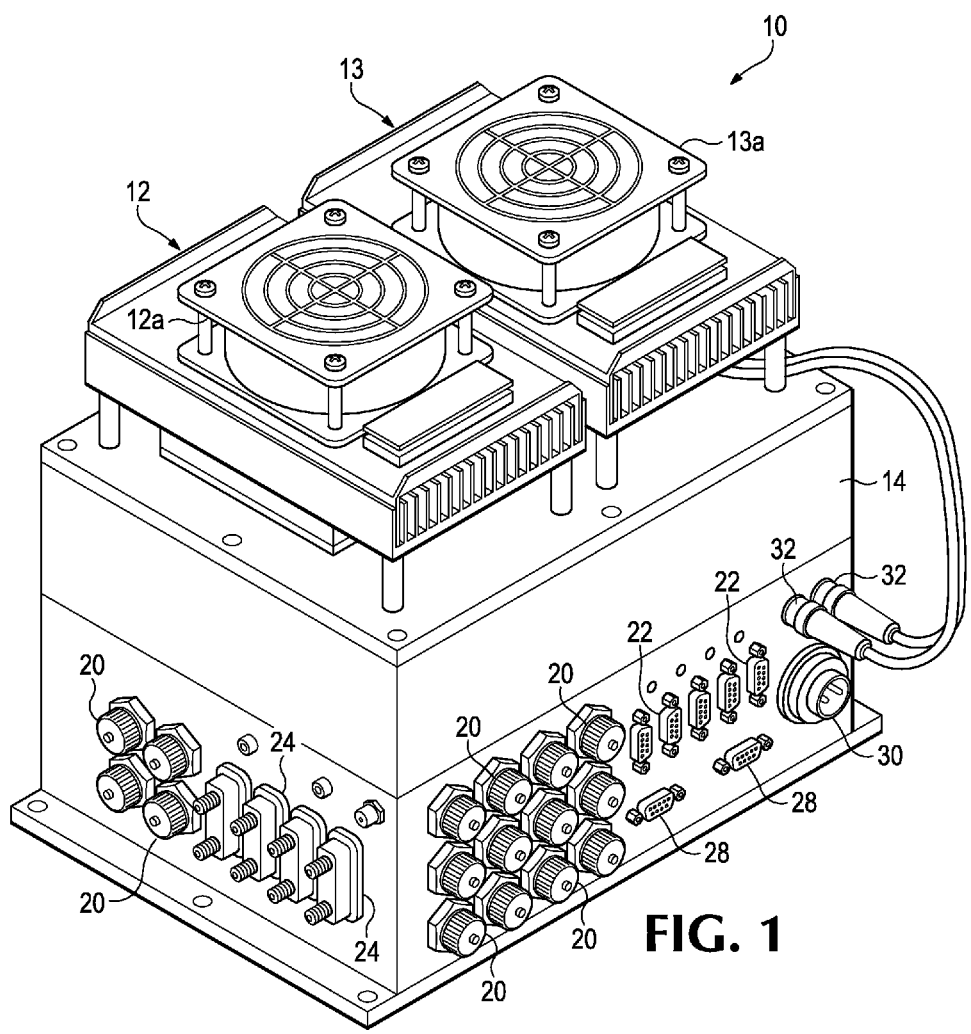
FIG. 1 is a perspective view of a computer assembly, according to the present invention.

Referring to FIG. 1, a computer assembly 10, includes a first solid state cooling unit 12 and a second cooling unit 13, that cools a surface of a liquid proof housing 14, in which the computer portion 16 of the computer assembly 10, is protected. The only moving parts of units 12 and 13 are parts of fans 12a and 13a. As fans 12a and 13a are extremely simple and rugged devices, not prone to failure and as there are no other moving parts to cooling units 12 and 13, they are very robust and have a very low failure rate.

Computer portion 16, accesses the outside world through a set of ruggedized connectors on the exterior of housing 14. These include RJ45 connectors 20, RS-232 connectors 22, VGA connectors 24, USB connectors 26 (FIG. 3) and CAN connectors 28. A power input port 30 is adapted to receive power at a voltage of between 10 and 36 VDC. Two power output ports 32 send power to cooling units 12 and 13. Skilled persons will readily recognize that a CAN connector designates a connector for a controller area network bus.

Figure 2:
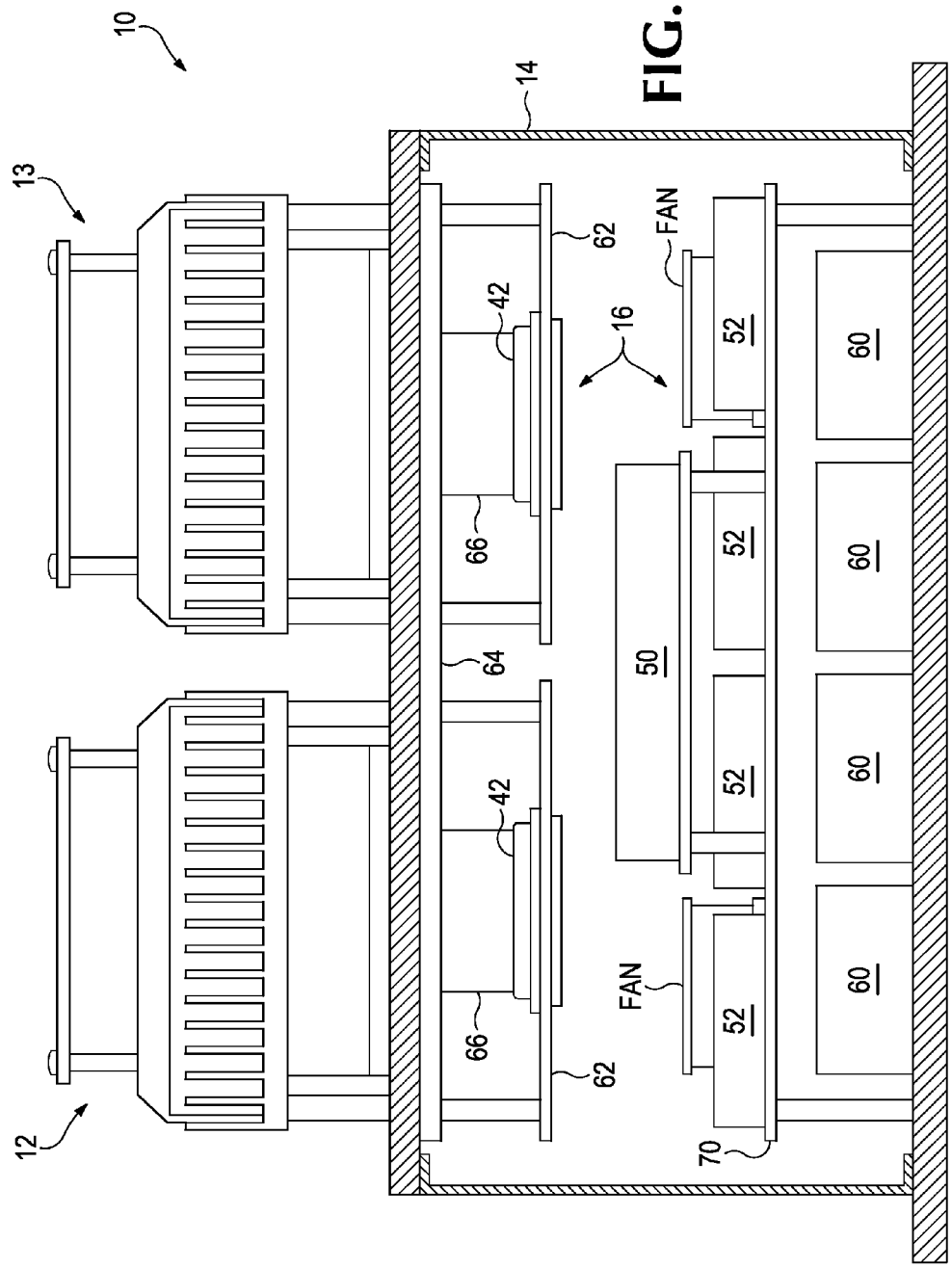
FIG. 2 is a block diagram of the electrical assembly of the computer assembly of FIG. 1.
Figure 3:
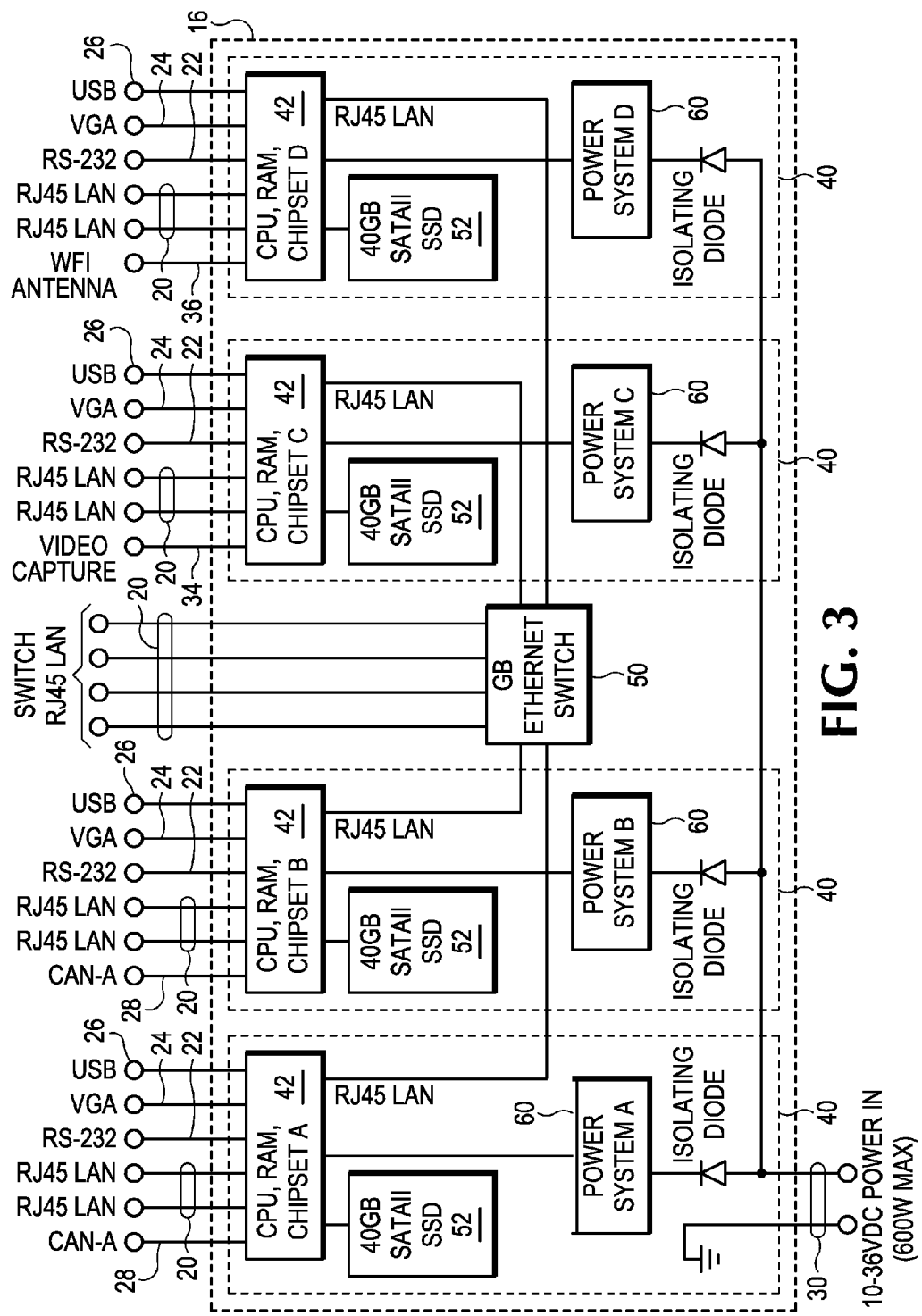
FIG. 3 is a physical diagram of the interior of computer assembly of FIG. 1.

Referring to FIGS. 2 and 3, in order to avoid interruptions to operations, four computer units 40, are provided inside housing 14. Each computer unit 40, includes a central computer block 42, that includes a CPU, RAM and a supporting chip set. In a preferred embodiment each CPU is an i5-560M Intel Dual Core Processor, each chipset is an Intel QM57 Express chipset and each RAM is a 4 GB DDR3 1066 memory. An Ethernet switch 50 connects together all of the CPUs 42 and permits the computer units 40 to be communicate and receive communications from the outside world by an outside set of RJ45 connectors 20. Also, each computer unit 40 is supported by a solid state hard drive 52 and has its own power system 60. Each power system 60 is adapted to accept power at a voltage of between 10 to 36 VDC and to deliver power at a steady 12 VDC.

Each central processing block 42 is mounted on a printed circuit board 62. Each board 62 is suspended from a copper plate 64 that is attached to the case 14. For each CPU a copper block 66 is resiliently suspended from copper plate 64, so that CPU 42 and copper block 66 generally move together. In addition, thermal grease is used to thermally couple CPU 42 with copper block 66, so that heat from CPU 42 flows through copper block 66 and copper plate 64 to case 14 and from there to cooling assemblies 12 and 13. Copper blocks 66 also provide thermal inertia to prevent over rapid temperature change in processing blocks 42 and physical inertia, to prevent over rapid acceleration or deceleration of processing blocks 42.

The redundancy permitted by having four CPUs permits a program structure that greatly augments system survivability by ghosting one solid state drive 52 onto another. This permits a second computer unit 40 to begin computing at the same operational point that a first computer unit 40 fails.

The liquid-proof housing 14 is preferably made of a metal having a high thermal conductivity, such as aluminum. As a result, the entire housing 14 is cooled by refrigeration units 12 and 13. An interior rack 70 holds the disk drives 52 and eight port Ethernet switch 50. A portion of the heat produced by disk drives 52, flows to rack 70 through rack 70 to housing 14 and through housing 14 to refrigeration units 12 and 13.

While a number of exemplary aspects and embodiments have been discussed above, those possessed of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

The invention claimed is:

1. A ruggedized computer assembly, comprising:
   (a) a liquids proof case, having an exterior;
   (b) a plurality of computers housed in said liquids proof case, each said computer having:
      (i) a central processing unit;
      (ii) a solid state hard drive; and
      (iii) a computer bus, terminating in a ruggedized connector at said case exterior; and
   (c) at least one power supply, connected to said computers;
   (d) wherein said plurality of computers are joined together communicatively by an Ethernet switch that is also coupled by a plurality of buses to said case exterior, for use by an outside system
   (e) at least one cooling unit mounted on said exterior of said liquids proof case, and positioned to cool said exterior to draw heat from inside said liquids proof case; and
   (f) for each said central processing unit, a physical structure attaching said central processing unit to said liquids proof case and wherein said physical structure also provides a thermal pathway for heat to travel from said central processing unit to a thermal destination on said case, and wherein for at least a first said central processing unit having a first said thermal destination and a first said cooling unit, said first cooling unit cools said exterior at a location corresponding to said thermal destination.

2. The assembly of claim 1, wherein said ruggedized connector is an RJ45.

3. The assembly of claim 1, wherein said ruggedized connector is an RS-232.

4. The assembly of claim 1, wherein said bus is a VGA bus.

5. The assembly of claim 1, wherein said bus is a USB.

6. The assembly of claim 1, wherein said plurality of computers consists of four computers.

7. The assembly of claim 1, wherein for at least one of said computers, said solid-state hard drive is mounted on a separate support surface from said central processing unit, and wherein heat produced by said solid-state drive follows a different path to said case, from said path of heat from said central processing unit.

8. The assembly of claim 7, wherein said separately mounted solid-state hard drive is mounted on an interior rack.

9. The assembly of claim 1, wherein for each one of said computers said central processing unit is mounted on a first support surface and said solid-state hard drive is mounted separate from said central processing unit on an interior rack, separate from said first support surface, and wherein heat produced by each said solid-state hard drive travels through said rack to said case.

10. The assembly of claim 1, wherein said at least one power supply includes a separate power supply for each of said computers, each said power supply, supplying power to a single computer.

11. The assembly of claim 10, wherein each said power supply is mounted separately from said computer to which it supplies power.

12. The assembly of claim 10, wherein each said power supply is mounted directly on an interior surface of said case.

13. The assembly of claim 1 wherein said first one of said computers includes a controller area network bus that is connected to a ruggedized connector at said case exterior.

14. The assembly of claim 1 wherein said first one of said computers includes a video capture bus that is connected to a ruggedized connector at said exterior.

15. The assembly of 1, wherein said system includes a controller area network bus and a video capture bus, each one connected to a ruggedized connector at said case exterior.

* * * * *